(12) United States Patent
Gatta

(10) Patent No.: US 7,652,520 B2
(45) Date of Patent: Jan. 26, 2010

(54) HIGH VOLTAGE GAIN TOPOLOGY FOR ANALOG CIRCUITS IN SHORT CHANNEL TECHNOLOGIES

(75) Inventor: Francesco Gatta, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 128 days.

(21) Appl. No.: 11/093,052

(22) Filed: Mar. 30, 2005

(65) Prior Publication Data

US 2006/0226464 A1    Oct. 12, 2006

(51) Int. Cl.
*H03K 17/687* (2006.01)
(52) U.S. Cl. .................................. 327/436; 327/581
(58) Field of Classification Search ............... None
See application file for complete search history.

(56) References Cited

U.S. PATENT DOCUMENTS

| | | | | |
|---|---|---|---|---|
| 4,584,662 A * | 4/1986 | Lin | ........... | 703/4 |
| 5,349,246 A * | 9/1994 | McClure | ........... | 326/22 |
| 5,687,355 A * | 11/1997 | Joardar et al. | ........... | 716/20 |
| 6,121,666 A * | 9/2000 | Burr | ........... | 257/408 |
| 6,124,174 A * | 9/2000 | Gardner et al. | ........... | 438/303 |
| 6,143,593 A * | 11/2000 | Augusto | ........... | 438/199 |
| 6,456,150 B1 * | 9/2002 | Sacco et al. | ........... | 327/534 |
| 6,559,715 B1 * | 5/2003 | Frake et al. | ........... | 327/558 |
| 6,576,939 B1 * | 6/2003 | Gilton et al. | ........... | 257/288 |
| 6,967,604 B2 * | 11/2005 | Maede et al. | ........... | 341/135 |
| 7,332,780 B2 * | 2/2008 | Matsuda et al. | ........... | 257/369 |

* cited by examiner

*Primary Examiner*—Lincoln Donovan
*Assistant Examiner*—Terry L Englund
(74) *Attorney, Agent, or Firm*—Sterne Kessler Goldstein & Fox, P.L.L.C.

(57) ABSTRACT

A stacked MOS configuration for use in short channel length analog circuit technologies is provided. The stacked MOS configuration comprises a plurality of short-channel MOS transistors coupled in series and sharing a common gate terminal. In an embodiment, a first peripheral transistor provides a drain terminal for the stacked MOS configuration. A second peripheral transistor provides a source terminal for the stacked MOS configuration. Adjacent transistors in the stacked MOS configuration are connected in a drain-to-source configuration.

15 Claims, 6 Drawing Sheets

100

HIGH VOLTAGE GAIN TOPOLOGY FOR ANALOG CIRCUITS IN SHORT CHANNEL TECHNOLOGIES

FIELD OF THE INVENTION

The present invention relates generally to short channel length MOS transistors. More particularly, the invention relates to a high voltage gain MOS topology for analog circuits in short channel technologies.

BACKGROUND OF THE INVENTION

With the current progress in scaling down MOS transistors to increasingly smaller dimensions, the trend is such that the dimensions involved will soon extend into the nanometer scale regime. As transistor geometries shrink, however, short-channel effects cause a variety of shifts in the behavior of MOS transistors away from conventional models.

In one aspect, the intrinsic gain of a short-channel MOS is around 20 dB, too low for many high-accuracy high-gain analog blocks. In another aspect, the gain variation due to temperature of a short-channel MOS can be up to 12 dB, complicating the design of short-channel temperature-insensitive analog blocks, such as bandgap and temperature sensor circuits.

One solution, commonly adopted in long-channel analog circuits, to improve the intrinsic gain of a transistor is to increase its channel length. Intuitively, widening the channel of a transistor increases its resistance, which, in turn, increases its intrinsic gain. In short-channel technology, however, this solution works adversely. In fact, an increase in the channel length of a short-channel MOS results in a decrease in the voltage required to deplete the channel, lowering the channel resistance and, consequently, the intrinsic gain of the MOS.

What is needed therefore is a high-gain MOS topology for short-channel analog circuits. Further, a MOS topology with reduced gain variation due to temperature is needed.

BRIEF SUMMARY OF THE INVENTION

The present invention relates to a high voltage gain MOS topology for analog circuits in short channel technologies.

In one aspect of the invention, a stacked MOS configuration for use in short channel length analog circuit technologies is provided. The stacked MOS configuration comprises a plurality of MOS transistors coupled in series and sharing a common gate terminal. In an embodiment, a first peripheral transistor provides a drain terminal for the stacked MOS configuration. A second peripheral transistor provides a source terminal for the stacked MOS configuration. Adjacent transistors in the stacked MOS configuration are connected in a drain-to-source configuration.

In another aspect of the invention, the stacked MOS configuration is used to replace an equivalent single MOS transistor block in a short channel length analog block. In an embodiment, the stacked MOS configuration provides a higher threshold voltage than the single MOS transistor block, thereby achieving lower leakage and better noise immunity. In another embodiment, the stacked MOS configuration results in a higher output resistance than the single MOS transistor, thereby providing higher intrinsic gain and lower gain variation due to temperature.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will be described with reference to the accompanying drawings. The drawing in which an element first appears is typically indicated by the leftmost digit(s) in the corresponding reference number.

DETAILED DESCRIPTION OF THE INVENTION

Intrinsic Gain of a MOS Transistor

Figure 1:
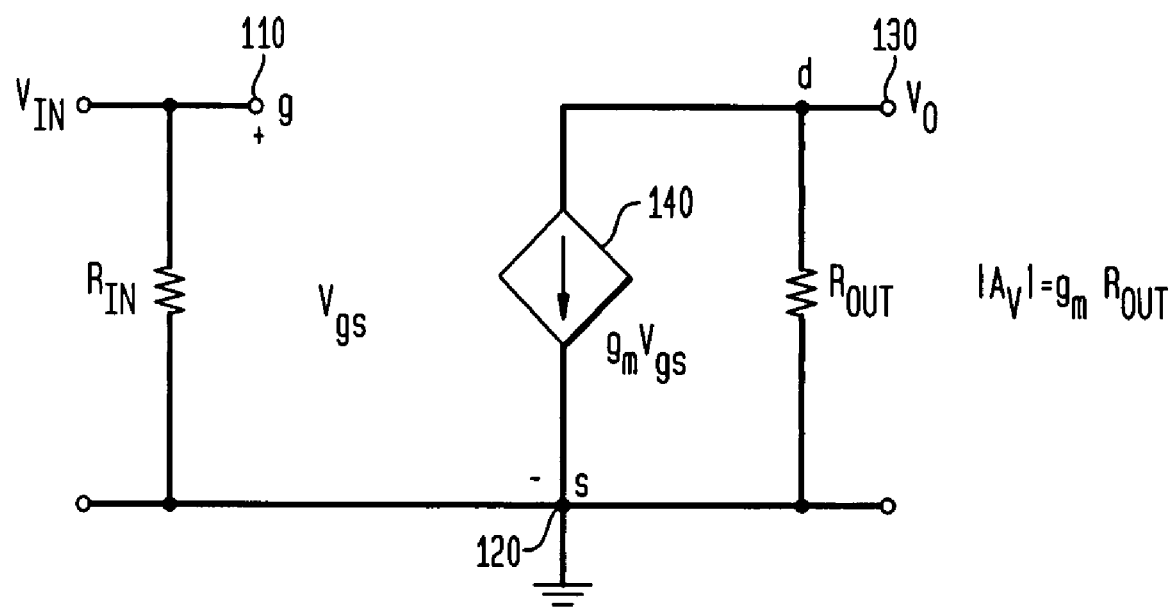
FIG. 1 illustrates a small-signal model representation of a MOS transistor.

FIG. 1 illustrates a small-signal model representation of a MOS transistor. The representation of FIG. 1 shows a circuit 100 having an input resistance $R_{in}$ (typically, on the order of $10^6$ Ohms) coupled between the gate 110 and the source terminal 120, a voltage-controlled current source 140 coupled between the drain 130 and the source terminal 120, and an output resistance $R_{out}$ coupled between the drain 130 and the source terminal 120.

An input voltage $V_{gs}$ is applied at the gate terminal 110, and an output voltage $V_o = V_{ds}$ is measured at the drain terminal 130. The source terminal 120 is coupled to ground. The voltage-controlled current source 140 is controlled by the gate-to-source voltage. In fact, the current flowing in the voltage-controlled current source 140 is equal to $g_m * V_{gs}$, where $g_m$ is the transconductance of the transistor.

The output voltage $V_o$ of the circuit 100 of FIG. 1 is the voltage measured across the output resistance and is equal to $-g_m * R_{out} * V_{gs}$. As a result, the voltage gain of the circuit 100 can be written as:

$$|A_V| = \left|\frac{V_o}{V_{in}}\right| = \frac{g_m R_{out} V_{gs}}{V_{gs}} = g_m R_{out} \qquad (1)$$

In equation (1), the voltage gain of the transistor depends only upon transistor parameters. For this reason, the gain in equation (1) is known as the intrinsic gain of the transistor, a parameter indicative of the voltage gain inherent in the transistor itself Intrinsic Gain Versus Channel Length Conventionally, the transconductance $g_m$ of a MOS transistor is equal to $\sqrt{2kI_D}$, where k is the transconductance parameter and $I_D$ is the drain current. Solid-state theory further shows that for MOS transistors, k can be written as:

$$k = \frac{W}{L}\mu_n C_{ox} \quad (2)$$

where W and L are the channel width and length, respectively, $C_{ox}$ is the capacitance per unit area of the oxide under the gate, and $\mu_n$ is the electron mobility.

From equation (2), it can then be noted that the transconductance $g_m$ of a MOS transistor is inversely proportional to the square root of the channel length $\sqrt{L}$.

The behavior of the output resistance $R_{out}$ as a function of the channel length L will now be described with reference to FIGS. 2A-2D.

FIGS. 2A-2D illustrate channel formation diagrams and corresponding electron energy diagrams for an NMOS transistor according to conventional MOS models. As is apparent to a person skilled in the art(s), equivalent diagrams for PMOS transistors are obtained by swapping the source and the drain terminal in the channel formation diagrams, and reversing the sense of the inequalities in the electron energy diagrams.

Figure 2A:
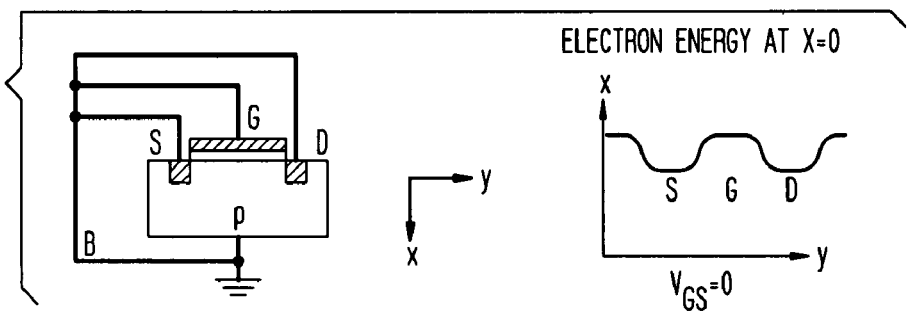
FIGS. 2A-2E illustrate channel formation diagrams and corresponding electron energy diagrams for an NMOS transistor.

In the NMOS transistor of FIGS. 2A-D, wells of highly dope n-type silicon (source and drain) are separated from a p-type substrate by depletion regions. As a result, an electron attempting to leave a well is repelled by negative ions in the p-material and retarded by positive ions in the n-material. FIG. 2A shows the energy barrier required for an electron to leave either well when $V_{GS}=0$. To reach the p-material, an electron from the source or the drain must possess energy corresponding to the energy depth of the well, but due to the high doping of the wells, electrons that possess this energy are negligible.

Figure 2B:
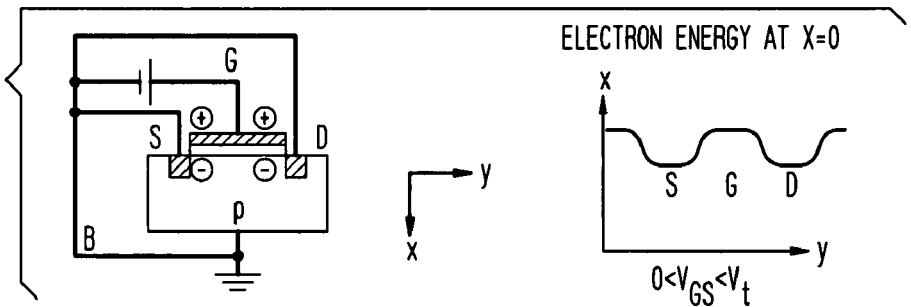

FIG. 2B shows the effect of placing a positive charge on the gate of the MOS transistor. In other words, when the gate-to-source voltage is made positive ($V_{GS}>0$), the positive charge on the gate repels any mobiles holes from the region near x=0 and attracts electrons trying to leave the wells towards the oxide beneath the gate. A narrow depletion region is created near x=0 extending from the source to the drain. Effectively, the surface potential of the region just under the oxide is lowered by placing positive charge on the gate.

Figure 2C:
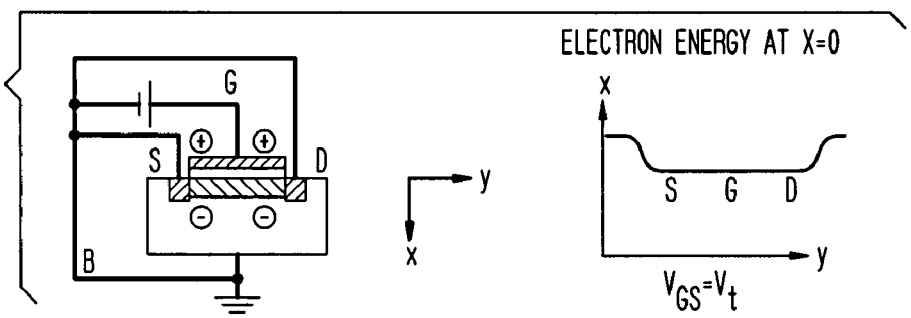

In order for an electron to move away from the oxide in the +x direction, however, more energy is required. FIG. 2C suggests that further increasing $V_{GS}$ further lowers the surface potential until $V_{GS}$ reaches a threshold voltage $V_t$ for which the surface potential is at the level of the electron wells. At this value of $V_{GS}$, the region below the gate is inverted and the surface potential has become negative. The channel is said to be depleted at this point. Electrons are free to move in the y direction between the source and the drain as long as there is a sizeable potential difference between the source and the drain.

Figure 2D:
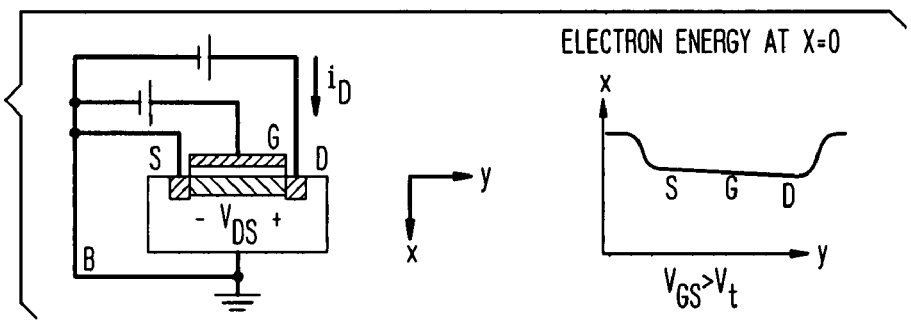

When $V_{GS}$ is increased past $V_t$, as shown in FIG. 2D, the surface potential does not decrease below the level of the electron wells, but instead conduction electrons are additionally attracted into the channel. Further, when the drain is made positive relative to the source, the drain potential is lowered causing electrons to drift from the source to the drain.

Figure 2E:
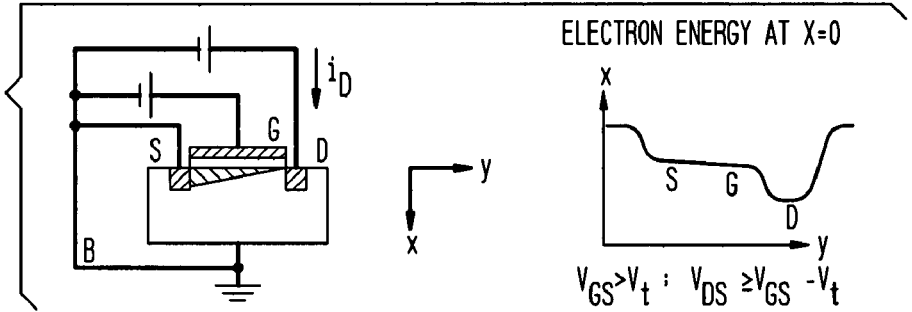

For large drain-to-source voltage $V_{DS}$, the voltage at the drain end of the channel becomes so large that the channel pinches off. The channel continues to exist at the source end, but increasingly positive values of $V_{DS}$ reduce the gate-to-channel voltage at the drain end. The density of channel electrons near the drain begins to diminish with increases in $V_{DS}$. Eventually, the channel depletion region disappears at the drain end as shown in FIG. 2E, and the channel is said to be pinched off. In terms of node voltages, this is the value of $V_{DS}$ that satisfies $V_{DG}=V_t$.

Beyond the pinch-off point, further increases in $V_{DS}$ widen the depletion region around the drain decreasing the effective channel length of the MOS and, in turn, increasing the current through the channel. The rate increase in current is equal to the rate decrease in channel length.

Typically, the decrease in effective channel due to large $V_{DS}$ is inversely proportional to the doping level of the substrate, and independent of the initial channel length of the MOS.

Therefore, given two MOS transistors having equal substrate doping levels but different channel lengths, for the same value of $V_{DS}$, an equal increase in $V_{DS}$ results in a larger rate increase in current for the transistor having the shorter channel length.

Consequently, since the output resistance of a MOS is defined as the ratio $$\frac{\Delta V_{DS}}{\Delta i_D},$$

the transistor having the shorter channel length also has the lower output resistance. Accordingly, the output resistance is directly proportional to the channel length L in a MOS transistor.

According to conventional MOS models then, the intrinsic gain $g_m * R_{out}$ of a MOS transistor is directly proportional to $$\left(\frac{1}{\sqrt{L}} L\right)$$

the square root of the channel length $\sqrt{L}$.

Accordingly, in conventional or long channel length MOS technologies, high-gain analog blocks make use of longer MOS channel devices in order to achieve a high $g_m * R_{out}$ intrinsic gain. The same technique does not work, however, in short channel length MOS technologies.

Figure 3:
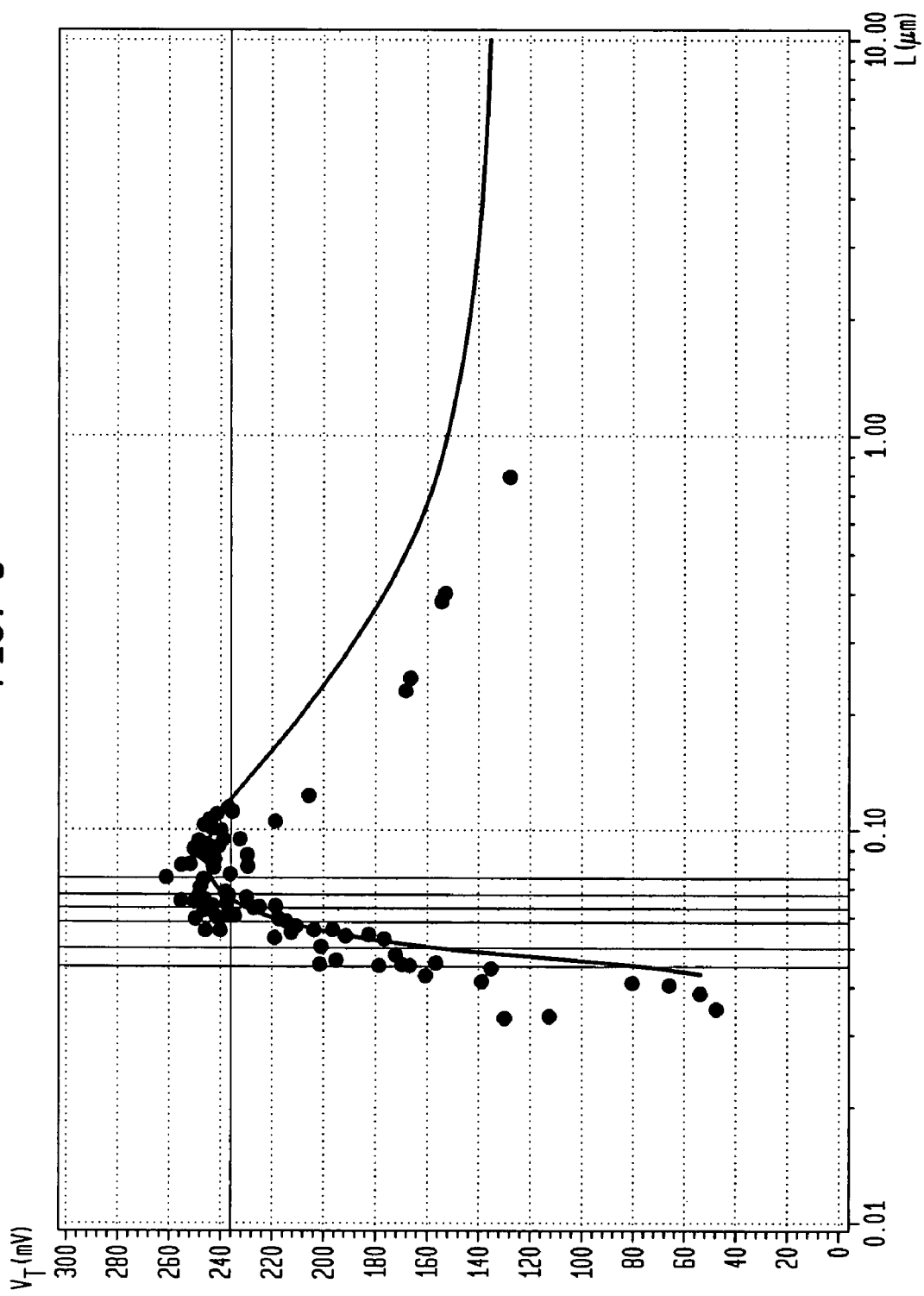
FIG. 3 illustrates a plot of threshold voltage V, versus channel length L for short channel length MOS transistors.

FIG. 3 illustrates a plot of the threshold voltage $V_t$ versus channel length L for short channel length MOS transistors. As can be noted from FIG. 3, the threshold voltage $V_t$ increases as a function of channel length L until it reaches a maximum around L=0.09 μm. For channel length values higher than 0.09 μm, however, the threshold voltage starts to decrease with respect to channel length. In other words, for the 90 nanometer scale technologies, increasing the channel length of a MOS transistor leads to a decrease in the voltage required to deplete the channel. This is in turn makes the $V_{DS}$ required to achieve channel pinch-off lower.

Equivalently, from a channel resistance aspect, the output resistance, defined as the ratio of the drain voltage to a unit increase in drain current, also decreases with increased channel length. As a result, the intrinsic gain $g_m * R_{out}$ decreases by increasing the channel length in short channel length MOS technologies.

Having a very low intrinsic gain typically, a challenge is thus faced in building high-gain analog blocks in short channel length technologies. An object of the present invention is to provide a high-gain building block for short channel length MOS technologies.

A Short-Channel High-Gain MOS Topology

As can be noted from the plot of FIG. 3, for channel length values higher than 0.09 μm, the threshold voltage of a MOS transistor increases with decreasing channel length. Accordingly, the intrinsic gain of a MOS block in that range can be increased by employing smaller channel length values.

Figure 4:
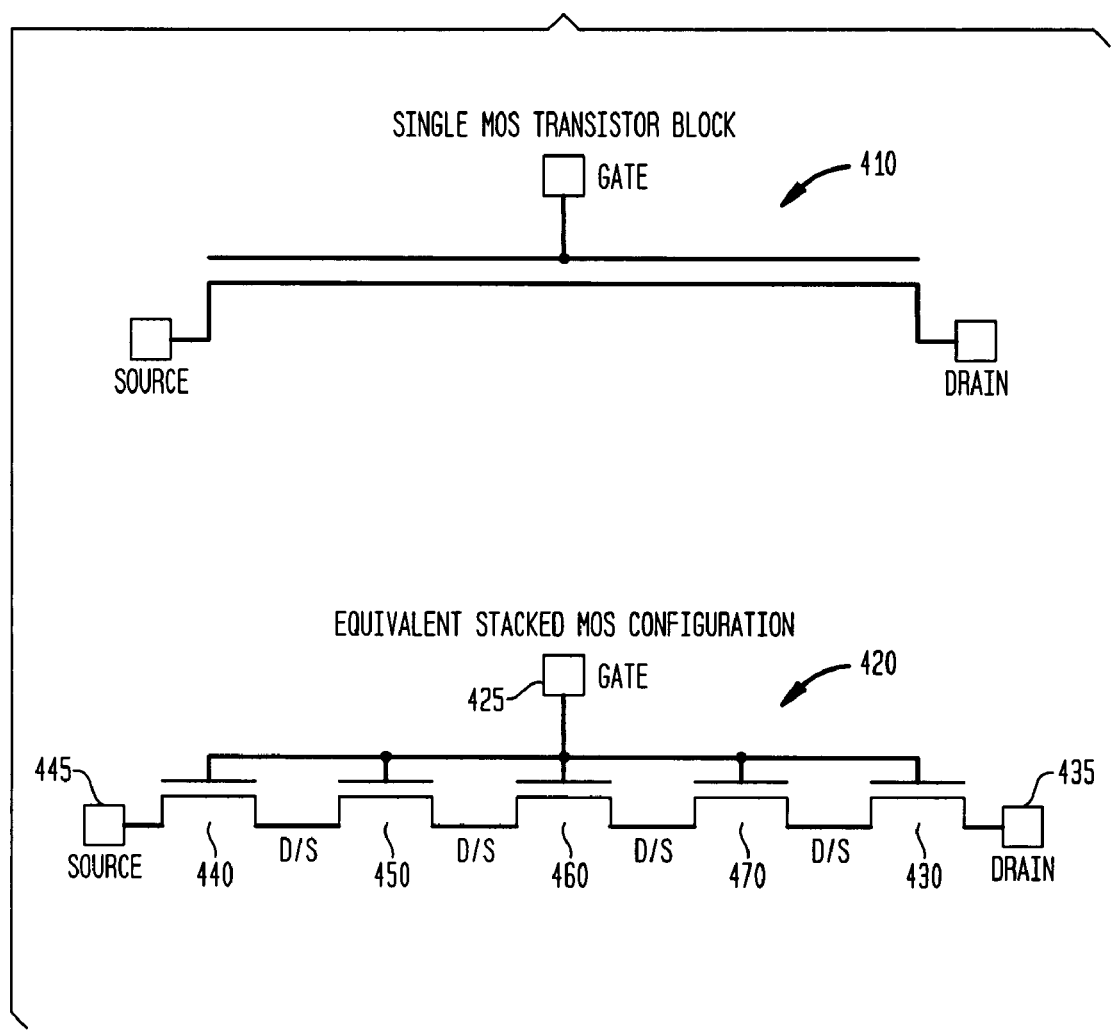
FIG. 4 illustrates a single MOS transistor block and an equivalent stacked MOS configuration according to the present invention.

FIG. 4 illustrates a single MOS transistor block 410 and an equivalent stacked MOS configuration 420 according to the present invention. In an embodiment, the stacked MOS configuration 420 comprises a plurality of MOS transistors 430, 440, 450, 460, and 470 coupled in series and sharing a common gate terminal 425. A first peripheral transistor 430 provides a drain terminal 435 for the stacked MOS configuration. A second peripheral transistor 440 provides a source terminal 445 for the stacked MOS configuration. Adjacent transistors of the stacked MOS configuration are connected in a drain-to-source configuration.

In an embodiment, the channel length of each of the MOS transistors in the stacked MOS configuration 420 is less than the channel length of the MOS transistor in the single MOS block 410. As a result, given that the channel length of the MOS transistor in the single MOS block 410 is within the channel length range described above, the stacked MOS configuration 420 will have a higher threshold voltage than the single MOS transistor block 410. This is true because, in the stacked MOS configuration, the stacked MOS transistors 430-470 all share the same gate terminal, and consequently, the effective threshold voltage of the stacked MOS configuration 420 is equal to the maximum of the threshold voltages of the stacked MOS transistors. In other words, in order to create a channel through the stacked MOS configuration 420, the MOS transistor in the stacked configuration having the highest threshold voltage needs to be turned on.

Accordingly, in an embodiment of the present invention, the stacked MOS configuration provides a higher threshold voltage than the single MOS transistor block. As a result, the stacked MOS configuration achieves lower leakage performance and better noise immunity than the single MOS transistor block. Also, by virtue of having a higher effective threshold voltage, the stacked MOS configuration has a higher effective output resistance, and, consequently, a higher intrinsic gain than the single MOS transistor block. As a result, the stacked MOS configuration is more suitable for high-accuracy high-gain analog circuits that the single MOS transistor block.

As it is understood by a person skilled in the art(s), the stacked MOS configuration, according to the present invention, may comprise any number of stacked MOS transistors coupled in series as shown in FIG. 4. Also, as is apparent to a person skilled in the art(s), the stacked MOS configuration, according to the present invention, may be implemented using n-type (NMOS) transistors, p-type (PMOS) transistors, or a combination thereof.

Also, as can be understood by a person skilled in the art(s), the stacked MOS configuration, according to the present invention, may be designed using various distributions of the stacked MOS channel lengths. In an embodiment, the stacked MOS transistors of a stacked MOS configuration have the same channel length value. In another embodiment, the stacked MOS transistors of a stacked MOS configuration have different channel length values.

In another aspect of the present invention, a stacked MOS configuration is used to replace an equivalent single MOS transistor block in a short channel length analog circuit. In an embodiment, an effective channel length of the stacked MOS configuration, equal to the sum of the channel lengths of the MOS transistors comprised in the configuration, is substantially equal to the channel length of the MOS transistor in the single MOS block.

Figure 5:
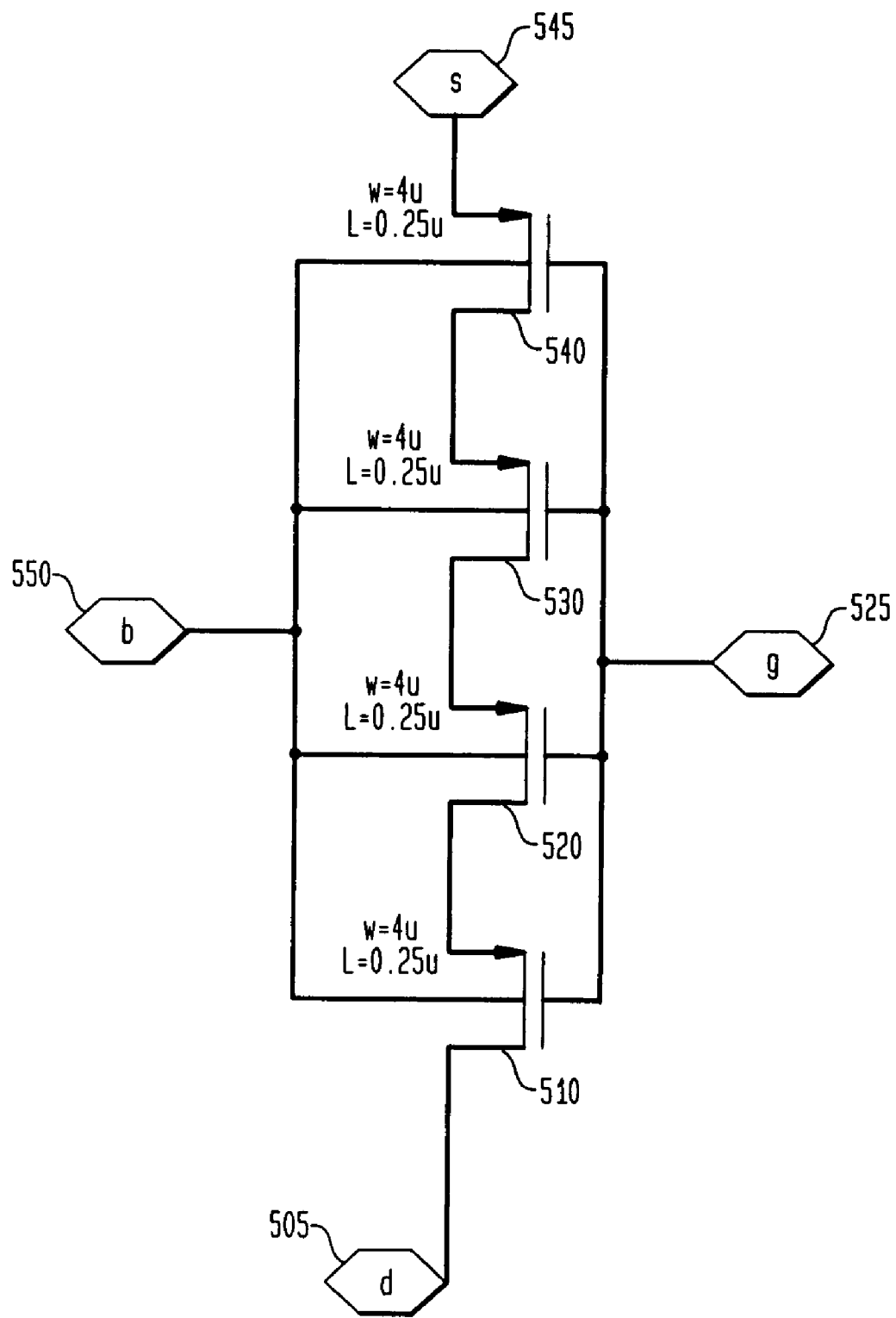
FIG. 5 illustrates an exemplary stacked MOS configuration according to an embodiment of the present invention.

FIG. 5 illustrates an exemplary stacked MOS configuration 500 according to an embodiment of the present invention. The example stacked MOS configuration 500 comprises four PMOS transistors 510, 520, 530, and 540 coupled in series and sharing a common gate terminal 525. The stacked MOS transistors also share a common bulk terminal 550 in the example of FIG. 5. A first peripheral transistor 510 provides a drain terminal 505 for the stacked MOS configuration 500. A second peripheral transistor 540 provides a source terminal 545 for the stacked MOS configuration 500. Adjacent transistors of the stacked MOS configuration 500 are connected in a drain-to-source configuration.

In the example of FIG. 5, the stacked PMOS transistors 510, 520, 530, and 540 have equal channel width and length of 4 and 0.25 microns, respectively. The effective channel length of the stacked MOS configuration 500 is equal to 1 micron. In an embodiment, the stacked MOS configuration 500 replaces an equivalent single MOS transistor of channel length substantially equal to 1 micron in an analog block. As can be noted from FIG. 3, the threshold voltage of the analog block then increases from ~120 mV using the single MOS transistor to ~190 mV using the stacked MOS configuration of FIG. 5. The intrinsic gain of the analog is also increased, as a result, by using the stacked MOS configuration 500.

As can be understood by a person skilled in the art(s), for any single MOS transistor block of channel length L, an optimal equivalent stacked MOS configuration exists according to the present invention. The optimal equivalent stacked MOS configuration has an effective channel length substantially equal to L. The optimal configuration also defines the number of MOS transistors in the stacked MOS configuration and a channel length distribution for the MOS transistors. The optimal equivalent stacked MOS configuration achieves the maximum intrinsic gain among all stacked MOS configurations equivalent to the single MOS transistor block.

Figure 6A:
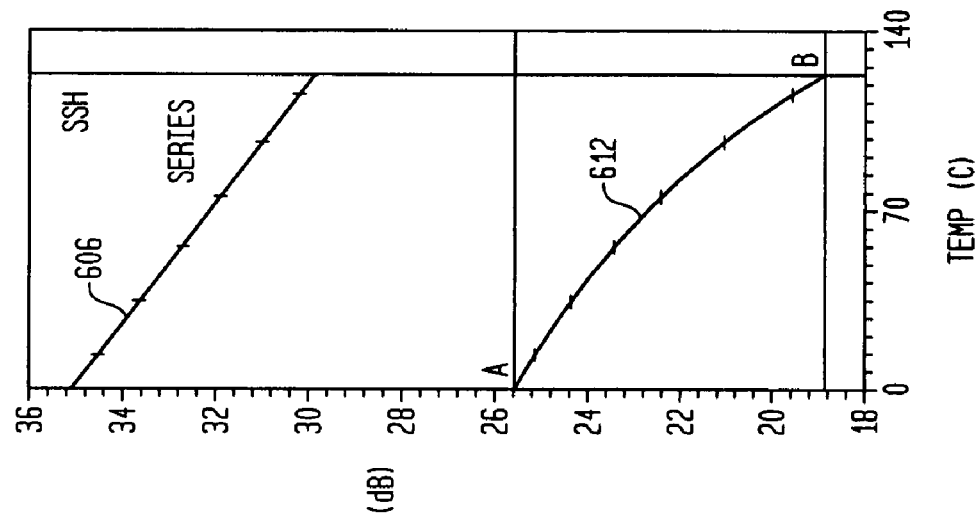
FIGS. 6A-6C illustrate comparative plots of intrinsic gain versus temperature for a single MOS transistor block and an equivalent stacked MOS configuration according to the present invention.
Figure 6B:
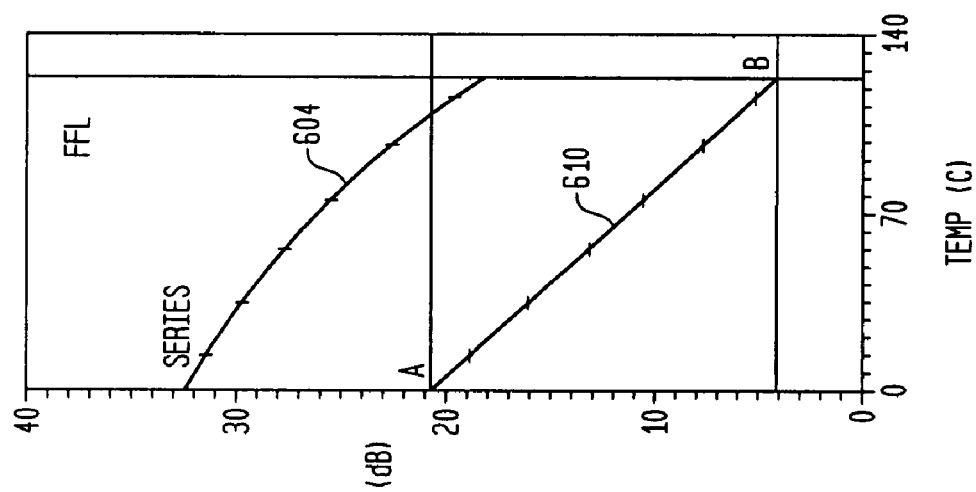
Figure 6C:
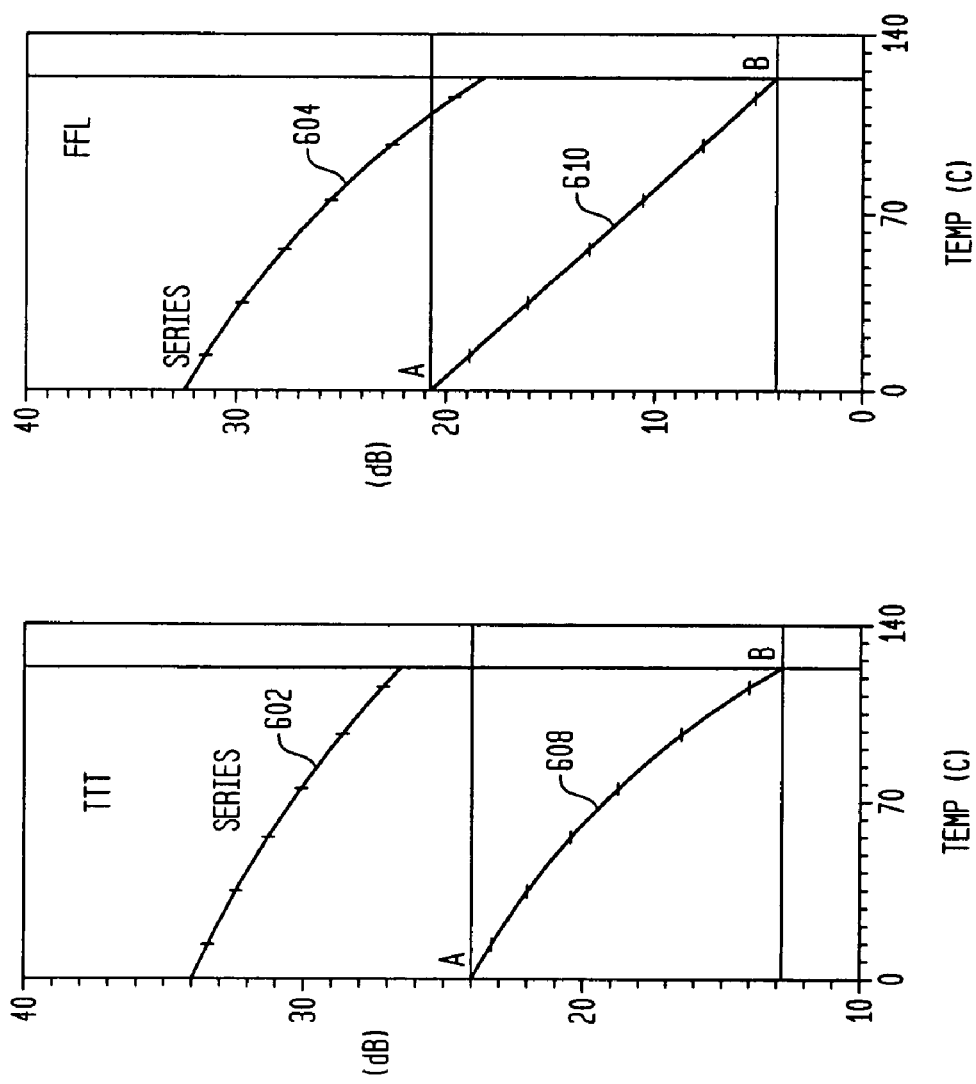

FIGS. 6A-6C illustrate exemplary comparative plots of intrinsic gain versus temperature for a single MOS transistor block and an equivalent stacked MOS configuration according to the present invention. In the plots of FIGS. 6A-6C, the y axis represents the intrinsic gain measured in dB. The x axis represents the temperature measured in degrees Celsius. Plots 6B and 6C are zoomed in versions of plot 6A. Lines 602, 604, and 606 correspond to the stacked MOS configuration, while lines 608, 610, and 612 correspond to the single MOS transistor block. As can be noted from plots, the intrinsic gain of the stacked MOS configuration is approximately 10-12 dB higher than that of the single MOS transistor block. The gain advantage of the stacked MOS configuration also seems to get larger as temperature increases. Further, lines 602, 604, and 604 have lower slopes than their respective lines 608, 610, and 612. This indicates that the intrinsic gain variation due to temperature of the stacked MOS configuration is less than that of the single MOS transistor. The gain performance of the stacked MOS configuration is then less sensitive to temperature variation than that of its equivalent single MOS transistor block. As a result, the stacked MOS configuration is more

What is claimed is:

1. A stacked MOS configuration, comprising:
   a plurality of MOS transistors, said plurality of MOS transistors coupled in series and having a common bulk and a common gate terminal;
   wherein the stacked MOS configuration is configured according to a defined number of MOS transistors and a channel length distribution for said MOS transistors such that a threshold voltage of at least one of said plurality of MOS transistors is greater than a threshold voltage of a single MOS transistor having a channel length substantially equal to an effective channel length of said stacked MOS configuration, and
   wherein the stacked MOS configuration provides an intrinsic gain that is greater than an intrinsic gain of said single MOS transistor.

2. The stacked MOS configuration of claim 1, wherein the effective channel length of the stacked MOS configuration is equal to a combined channel length of the plurality of MOS transistors in said stacked MOS configuration.

3. The stacked MOS configuration of claim 1, wherein a drain terminal of a first peripheral transistor in the stacked MOS configuration serves as a drain terminal for said stacked MOS configuration, and a source terminal of a second peripheral transistor in the stacked MOS configuration serves as a source terminal for said stacked MOS configuration.

4. The stacked MOS configuration of claim 1, wherein adjacent MOS transistors in the stacked MOS configuration are coupled in a drain-to-source configuration.

5. The stacked MOS configuration of claim 1, wherein the plurality of MOS transistors comprise NMOS transistors.

6. The stacked MOS configuration of claim 1, wherein the plurality of MOS transistors comprise PMOS transistors.

7. The stacked MOS configuration of claim 1, wherein the plurality of MOS transistors have substantially equal channel lengths.

8. The stacked MOS configuration of claim 1, wherein at least one of the plurality of MOS transistors has a channel length that is different than channel lengths of the other MOS transistors in the stacked MOS configuration.

9. The stacked MOS configuration of claim 1, wherein an effective threshold voltage of the stacked MOS configuration is higher than said threshold voltage of the single MOS transistor.

10. The stacked MOS configuration of claim 9, wherein the stacked MOS configuration has lower leakage and better noise immunity than the single MOS transistor.

11. The stacked MOS configuration of claim 1, wherein an effective output resistance of the stacked MOS configuration is higher than an output resistance of the single MOS transistor.

12. The stacked MOS configuration of claim 1, wherein the intrinsic gain of the stacked MOS configuration is less sensitive to temperature variation than the intrinsic gain of the single MOS transistor.

13. The stacked MOS configuration of claim 1, wherein said effective channel length of said stacked MOS configuration is greater than or equal to 0.09 microns.

14. The stacked MOS configuration of claim 1, wherein said effective channel length of said stacked MOS configuration is greater than or equal to 0.09 microns but not greater than 0.13 microns.

15. The stacked MOS configuration of claim 1, wherein said single MOS transistor is a 90 nanometer scale MOS transistor.

* * * * *

UNITED STATES PATENT AND TRADEMARK OFFICE
CERTIFICATE OF CORRECTION

PATENT NO.       : 7,652,520 B2                                               Page 1 of 1
APPLICATION NO.  : 11/093052
DATED            : January 26, 2010
INVENTOR(S)      : Francesco Gatta It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 170 days.

Signed and Sealed this

Twenty-third Day of November, 2010

David J. Kappos
*Director of the United States Patent and Trademark Office*